(12) United States Patent
Blair, II et al.

(10) Patent No.: US 10,581,975 B2
(45) Date of Patent: Mar. 3, 2020

(54) SYSTEM AND METHOD FOR SMART FACILITIES MONITORING

(71) Applicant: Walmart Apollo, LLC, Bentonville, AR (US)

(72) Inventors: Richard M. Blair, II, Bentonville, AR (US); Steven Lewis, Bentonville, AR (US); Anthony G. Wind, III, Gravette, AR (US)

(73) Assignee: WALMART APOLLO, LLC, Bentonville, AR (US)

( * ) Notice: Subject to any disclaimer, the term of this patent is extended or adjusted under 35 U.S.C. 154(b) by 99 days.

(21) Appl. No.: 15/982,541

(22) Filed: May 17, 2018

(65) Prior Publication Data
US 2018/0338006 A1    Nov. 22, 2018

Related U.S. Application Data

(60) Provisional application No. 62/508,491, filed on May 19, 2017.

(51) Int. Cl.
| | |
|---|---|
| *H04L 29/08* | (2006.01) |
| *G08B 13/196* | (2006.01) |
| *G08B 21/18* | (2006.01) |
| *G01R 22/06* | (2006.01) |
| *H04W 4/02* | (2018.01) |
| *G06K 9/00* | (2006.01) |
| *G08B 21/22* | (2006.01) |

(52) U.S. Cl.
CPC .......... *H04L 67/125* (2013.01); *G01R 22/068* (2013.01); *G06K 9/00288* (2013.01); *G08B 13/196* (2013.01); *G08B 21/185* (2013.01); *G08B 21/22* (2013.01); *H04W 4/02* (2013.01)

(58) Field of Classification Search
CPC ... H04L 67/125; G08B 13/196; G08B 21/185; G01R 22/068; G06K 9/00288
See application file for complete search history.

(56) References Cited

U.S. PATENT DOCUMENTS

| | | | |
|---|---|---|---|
| 6,553,336 B1 * | 4/2003 | Johnson | G01D 3/022 |
| | | | 702/188 |
| 6,751,573 B1 | 6/2004 | Burch | |
| (Continued) | | | |

OTHER PUBLICATIONS

International Search Report and Written Opinion dated Aug. 13, 2018 in corresponding International Application No. PCT/US18/33211 (9 pp).

*Primary Examiner* — Vivek Srivastava
*Assistant Examiner* — Muhammad Raza
(74) *Attorney, Agent, or Firm* — Venable LLP; Jeffri A. Kaminski

(57) ABSTRACT

Systems, methods, and computer-readable storage media for smart facilities monitoring. Servers and other computing devices configured according to this disclosure can receive data, in real-time or at periodic intervals, from multiple sensors. The server can identify the type of data being received and perform an analysis on the data. Based on that analysis, the server can determine if a notification needs to be communicated to an individual. This notification can, for example, inform the individual of a problem identified by the sensor. The server can generate the notification, determine to whom the notification should be sent, and transmit that notification.

18 Claims, 4 Drawing Sheets

(56) References Cited

U.S. PATENT DOCUMENTS

| | | | |
|---|---|---|---|
| 7,590,476 B2* | 9/2009 | Shumate | G05B 23/0221 |
| | | | 701/31.6 |
| 8,832,244 B2 | 9/2014 | Gelvin et al. | |
| 8,868,616 B1 | 10/2014 | Otto et al. | |
| 9,141,181 B2 | 9/2015 | Starr | |
| 9,467,500 B2 | 10/2016 | Maturana et al. | |
| 2005/0273593 A1 | 12/2005 | Seminaro et al. | |
| 2009/0254240 A1* | 10/2009 | Olsen, III | G06Q 10/06 |
| | | | 701/29.5 |
| 2010/0111377 A1 | 5/2010 | Monroe | |
| 2012/0041716 A1* | 2/2012 | Higginbotham | G06Q 10/06 |
| | | | 702/184 |
| 2013/0226320 A1 | 8/2013 | Berg-Sonne et al. | |
| 2013/0298652 A1 | 11/2013 | Gillette, II | |
| 2013/0311140 A1* | 11/2013 | Schechter | H04L 67/34 |
| | | | 702/188 |
| 2013/0317780 A1* | 11/2013 | Agarwal | G05B 23/0248 |
| | | | 702/181 |
| 2015/0097949 A1 | 4/2015 | Ure et al. | |
| 2016/0314405 A1* | 10/2016 | Bihannic | G06Q 10/20 |
| 2017/0102978 A1* | 4/2017 | Pallath | G06F 11/0709 |

\* cited by examiner

SYSTEM AND METHOD FOR SMART FACILITIES MONITORING

BACKGROUND

1. Technical Field

The present disclosure relates to facilities monitoring, and more specifically to combining data from multiple types of sensors, then analyzing the combined data to determine if an alert should be generated based on the data received.

2. Introduction

The "Internet of Things" is the general name given to the concept of allowing computing devices embedded in everyday objects to send and receive data, thereby allowing monitoring and control of those devices from a centralized location. For example, lights and kitchen appliances can be remotely controlled, door bells can be remotely monitored, and thermostats programmed and accessed through a network. While most of these devices currently operate alone, some can be chained together using conditional statements. For example, the web-based service IFTTT (IFTTT.com, which stands for "If This Then That") allows users to create "If-Then" statements on how to proceed if a certain condition is met on a connected device or service.

SUMMARY

A method based on the concepts disclosed herein can, for example, include: receiving, at a server, data associated with a sensor in a plurality of sensors; identifying a sensor type for the sensor; analyzing, based on the sensor type, the data, to yield an analysis; determining, based on the analysis, that a notification associated with the data needs to be communicated to an individual; identifying the individual from a plurality of individuals based on the sensor type and the analysis; and transmitting, over a network, the notification to a device associated with the individual.

A system comprising: a processor; and a computer-readable storage device having instructions stored which, when executed by the processor, cause the processor to perform operations comprising: receiving first data associated with a first sensor in a plurality of sensors associated with a device, the first sensor being of a first sensor type; receiving second data associated with a second sensor in the plurality of sensors, the second sensor being of a second sensor type which is distinct from the first sensor type; analyzing the first data, the second data, and a current time, to yield a probable fault associated with the device and an estimated repair time to correct the probable fault; determining, based on the first data, the second data, the current time, and the estimated repair time, an urgency in evaluating the device; determining that the urgency meets a threshold level, to yield a determination; generating, based on the determination, an automated notification to be communicated to an individual, the automated notification prompting the evaluating of the device; selecting the individual by: receiving an electronic signal for each individual in a plurality of individuals, the electronic signal comprising a location of each individual and an identity of each individual; and identifying the individual from the plurality of individuals based on the location of the individual with respect to the device; and transmitting, over a network, the notification to a mobile device associated with the individual.

A non-transitory computer-readable storage medium configured to practice the concepts disclosed herein can include instructions stored which, when executed by a computing device, cause the computing device to perform operations including: receiving, at a server, data associated with a sensor in a plurality of sensors; identifying a sensor type for the sensor; analyzing, based on the sensor type, the data, to yield an analysis; determining, based on the analysis, that a notification associated with the data needs to be communicated to an individual; identifying the individual from a plurality of individuals based on the sensor type and the analysis; and transmitting, over a network, the notification to a device associated with the individual.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

DETAILED DESCRIPTION

Figure 1:
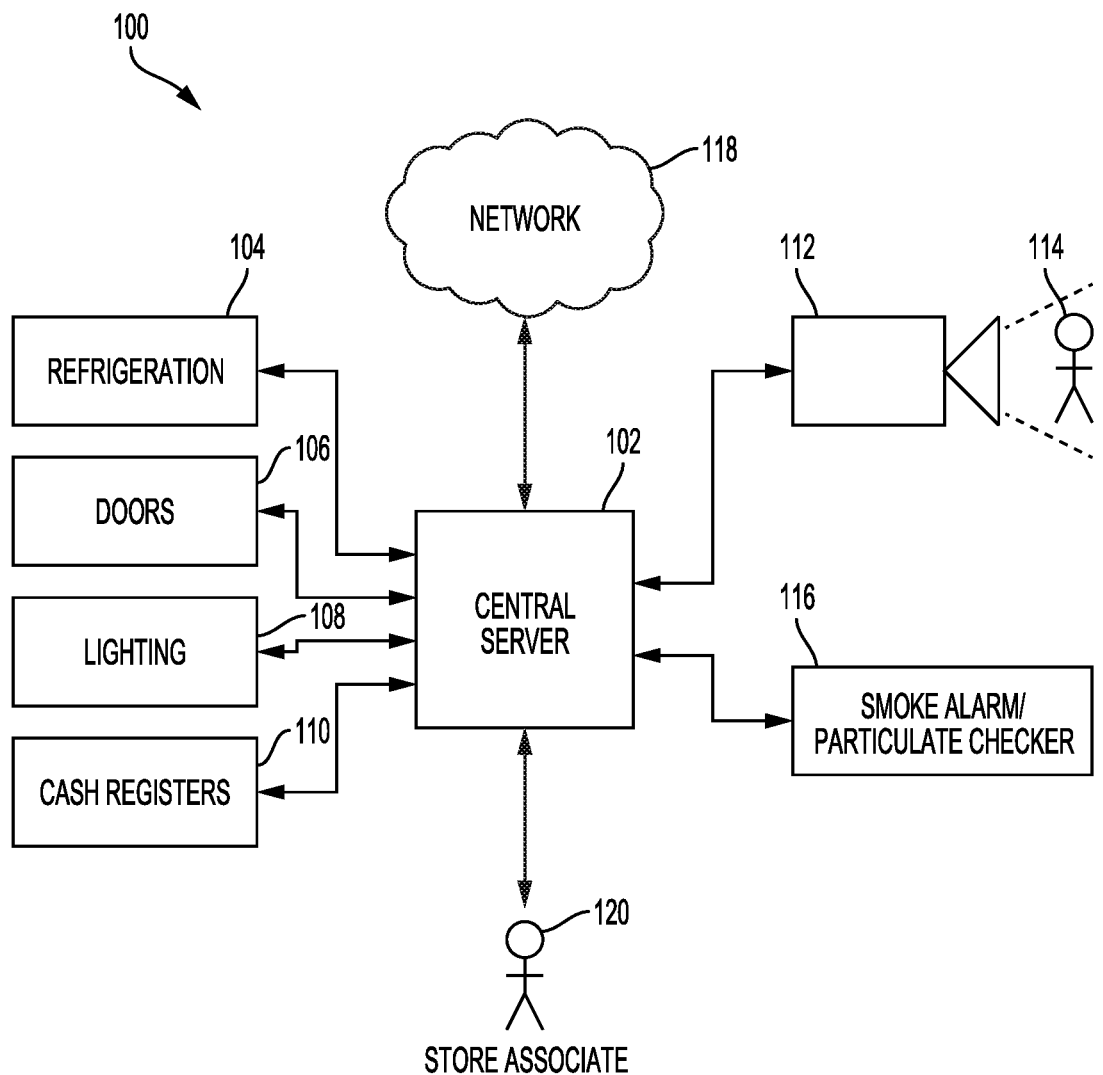
FIG. 1 illustrates an example system architecture.

A system, method and computer-readable media are disclosed which provide for smart facility monitoring. Data is received from sensors associated with a known geographic location, such as a store, an office building, a warehouse, a museum, a shopping facility, or a supermarket. As the data is received in real-time, systems configured according to this disclosure can (1) identify particular individuals which need to be contacted based on the conditions being detected by the sensors, and (2) can combine data from multiple sensor types, analyze the combined data, and draw conclusions based on the multiple sensor-type inputs.

Consider the following example. A store, configured according to this disclosure, is equipped with refrigeration units for frozen groceries. Each refrigeration unit contains multiple sensor types, such as an electrical current sensor which detects how much current the refrigeration unit's electrical motor is consuming, a coolant pump pressure sensor, a vibration sensor which collects information about mechanical vibrations of the coolant pump, a temperature sensor, and a door opened/closed sensor. Each of these sensors is reporting data to a store server, with the information being reported taking the exemplary form of [Sensor Result; Sensor ID]. Such reporting can occur on a periodic basis (i.e., every thirty seconds), or can occur when a trigger condition is met (i.e., the door sensor can report every time the door is opened, then again when the door is closed).

As the data is received by the store's server, the server collects the data (i.e., in a table or other data format) for the refrigeration unit. This data collection for the unit expands over time, resulting in a history of data specific for the refrigeration unit. The store server, while the data is being collected, performs a device specific analysis based on the data currently being received and the historical data previously collected, and uses the disparate information from the multiple sensor types to evaluate the overall condition of the refrigeration unit. When specific conditions are met, the server can determine a store associate, maintenance personnel, or other individual should be notified to perform an action associated with the refrigeration unit.

Identifying who should be contacted depends on the specific conditions detected. For example, rather than always contacting a store associate regardless of the type of conditions detected, the server can determine, for example, that a specific sensor on the refrigeration unit has gone out, and can contact in-store maintenance personnel to replace the sensor. In another example, the server can determine that the door is simply ajar, and contact the store associate to close the door. In yet another example, the server can determine that the refrigeration unit's pump has gone out, and can contact a third-party repairman to repair the pump. Such third-party contact can, for example, take the form of sending a fax or sending a digital communication (i.e., an email or SMS message), or can take the form of generating a text message, converting the text to speech (i.e., a text-to-speech conversion), and contacting the third-party repairman via an audio phone call. In all of these examples, the server is contacting the individual best equipped to perform a specific task based on the current conditions of the refrigeration device.

In any given geographic location, there can be sensors for identifying motion, people, weight, color, temperature, and/or light, as well as sensors which may be specific to an individual device. The server can combine sensor data from all of these sensors (i.e., multiple types of sensors), perform an automated diagnostic based on historical data and the real-time data currently being received, and determine if an individual needs to be contacted based on the conclusion of the server's analysis. The server can also determine the urgency of specific conditions, which can likewise affect who is contacted and the message that individual receives. Consider the following examples.

Example 1

Sensor Input:
  Electrical current sensor indicates sudden very light load on electrical motor.
  Coolant pump pressure sensor indicates low coolant pressure.
  Vibration sensor indicates no mechanical vibration normally associated with pump operation.
  Temperature sensor indicates gradual rise in temperature while door sensor indicates no activity on the door for a last 6 hours.
  Time of day is 2 AM.
Probable conclusion:
  Motor to pump belt is broken.
  Estimated repair time 45 minutes.
Urgency: Temperature rise rate and time of day can indicate urgency of the repair.
  Needs to be repaired by 8 AM when door activity is expected to resume.

In Example 1, the server is receiving real-time data from four distinct types of sensors, combining the data from those four sensors, performing an analysis on the data (by comparing the combined data to historical information and/or known combinations of sensor data and associated faults), and making a probable conclusion based on that analysis. In this case, the server concludes that the pump belt is broken, and that the estimated repair time is 45 minutes. The server uses that 45 minute repair time, the time of day, and the device affected to determine an urgency of the repair. In this case, the server determines that the device needs to be repaired before 8 am, and contacts a specific individual based on the type of action required and the urgency of the action.

Example 2

Sensor Input:
  Electrical current sensor indicates increased use of electrical motor.
  Coolant pump pressure sensor indicates normal coolant pressure.
  Vibration sensor indicates mechanical vibration normally associated with pump operation.
  Temperature sensor indicates fairly rapid rise in temperature while door sensor indicates no activity on the door for a last 2 hours.
  Door position sensor indicates door is closed but video analysis triggered by temperature and motor alarms indicate door is slightly open.
Probable conclusion:
  Door position sensor may be malfunctioning.
  Estimated repair time 60 minutes.
  Door is not closing completely using normal mechanisms. May be physically blocked by product shifting requiring associate intervention.
Urgency: Temperature rise rate and time of day can indicate urgency of the repair.
  Need associate intervention to close door before product loss occurs.
  Should have maintenance evaluate door position sensor. This may be accomplished by instructions being provided through an automated diagnostic sequence to a mobile device belonging to the maintenance personnel.

In Example 2, the server performs similar functions (i.e., real-time combining of sensor data having distinct sensor types, analyzing the combined data, and making a diagnostic). However, in this example, the server has identified that two distinct individuals need to be contacted to perform distinct roles in correcting the device issues. An associate is notified to close the door before product loss occurs, while maintenance personnel are notified to evaluate the door position sensor. In other configurations, the associate responsible for closing the door can also the maintenance personnel.

Example 3

Sensor Input:
  Temperature sensor indicates area of building is slowly cooling.
  Air pressure sensors indicate air plenum pressure for that area of the building is within valid range.
  Heating water temperature sensor indicates hot water is available for heat exchangers.
  Heating water flow sensors indicates hot water consumption is in normal range for the area of the building.
  Automated diagnostics detect plenum air pressure change when individual plenum vents are actuated.
  Automated diagnostics detect heating water flow changes for all solenoid operated valves except one, which is in the area of the building that is under temperature.
  Electrical current sensor on the solenoid indicates power being applied when expected.

Probable conclusion:
 Solenoid operated valve on heater vent is not operating correctly.
 Estimated repair time 120 minutes.
Urgency: Temperature rise rate and time of day can indicate urgency of the repair.
 Non-critical condition exists.
 Maintenance should evaluate and repair solenoid or valve during low traffic period.

In this example, the server makes the determination that while there may be a problem with the solenoid operated valve, the fault does not have a level of urgency requiring immediate repair. Instead, the server can notify maintenance personnel to evaluate and repair the solenoid during low traffic periods.

Additional examples and embodiments are described in detail below. While specific implementations are described, it should be understood that this is done for illustration purposes only. Other components and configurations may be used without parting from the spirit and scope of the disclosure.

FIG. 1 illustrates an example system architecture 100. In this example, a central server 102 receives data from sensors associated with various devices 104-112. Exemplary devices can include refrigeration units 104, doors 106, lighting equipment 108, cash registers 110, smoke alarms/particulate checkers 116, and video cameras 112. Information from sensors associated with these devices 104-112, 116 is received by the central server 102, which analyzes the information and makes determinations based on that analysis.

Where the data being received is within safe/normal thresholds, the server 102 can record the data and make the determination that no notification needs to be generated/sent to any individuals. For example, if the data being received is within prescribed thresholds, the server 102 can determine that no notification needs to be generated and sent. If the data being received is outside of the predetermined thresholds, then the server 102 can determine (1) that a notification should be sent and also determine (2) to whom the notification should be sent.

In further embodiments, the server 102 may itself determine if an action is required and what that action is. The determining may be based on machine learning or a comparison of the data from the sensors to the ranges and thresholds mentioned above. For example, the server 102 can receive data from multiple sensors associated with multiple sensor types, combine the data from the multiple sensor types, and then apply a machine learning algorithm in evaluating the combined sensor data. As repairs are made, the server 102 can record if the predictions made regarding broken devices, etc., were correct, and can iteratively update the machine learning algorithm to provide improved analysis and accuracy in making diagnostics.

In determining the individual to which the notification should be sent, the server 102 can use multiple types and sources of information. For example, in addition to the data being received, the server 102 can use the type of data associated with the respective device 104-112 from which the data is coming. The server 102 can also rely on a private database having contact information (for example, of employees of a company or personnel associated with a facility) and/or on public information obtained from the Internet (such as repairmen or emergency services such as the local police and fire departments).

In one example, the server 102 determines that a store associate 120 should be informed via a notification. The server 102 can contact the store associate 120 using mechanisms such as sending a message to a mobile device (i.e., an MC40, smartphone, or other hand-held computing device) associated with the store associate 120, email, or automatically alerting the store associate 120 using an intercom system. Consider the following more specific example. The server 102 has received data from lighting equipment 108. The server 102 may analyze the data and determine from the data that the lights in a portion of the store should be replaced. The lighting equipment 108 itself may also generate and send a signal that the lights in a portion of the store should be replaced. The server 102 can identify the store associate 120 physically located closest to that portion of the store and send a notification to that associate to check and/or replace the lights. In another example, the server 102 can receive data from a cash register 110, indicating that the cash register 110 is not functioning correctly. The server 102 can send the store manager a notification to immediately check on the cash register.

In yet another example, the server 102 can receive a video feed from a camera 112 of a possible intruder 114 who has been determined to be in a location of the store which is off limits. The server 102 can compare the location to known locations of store associates 120 and, if the possible intruder 114 in the video feed is not a store associate (and therefore not authorized to be in the restricted area), the server 102 can determine a notification should be made regarding the possible intruder 114. In some instances, this can cause a communication to a store associate 120 or a manager. In other cases, this can cause a notification be sent across a network 118 to a monitoring service, who can review the live feed from the camera 112 and determine if the manager or law enforcement should be informed of the intruder 114. In yet other instances, the server 102 can automatically notify law enforcement by calling an emergency number (e.g., "911") and using a pre-recorded statement to inform the law enforcement of the intrusion.

In the given examples, the central server 102 can, upon receiving the data from the devices 104-112, 116, compare the data received against predetermined thresholds and checklists. For example, multiple sensors may be associated with each refrigeration unit in the store, such as one sensor for a door to the refrigeration unit (indicating if the door is open or closed) and another sensor recording electricity usage. The server 102 can receive information from both sensors and, using checklists and flowcharts specific to the device (in this case, the refrigeration units 104), make determinations on who should be contacted and what action they should take. If, for example, the refrigeration unit 104 is showing an increase in electricity usage combined with an open door, the server 102 can send the nearest store associate 120 to close the door. If the refrigeration unit 104 is showing an increase in electricity usage with a closed door, the server 102 can check information such as the last maintenance date for the refrigeration unit 104, how long the refrigeration unit 104 has been in service, the average point of failure for the model of refrigeration unit to which this unit 104 corresponds, and what the average electrical usage is for units associated with those statistics. Using this information, the server 102 can determine if maintenance personnel should be contacted or if the refrigeration unit 104 should be replaced.

In some embodiments, the server 102 may determine that an item is removed from a shelf, refrigeration unit, etc. for purchase by a customer. This determination may be based on the information from the various sensors. For example, the server 102 may determine that the door of the refrigeration unit 104 is open, and that a customer is standing in front of the refrigeration unit 104 and an item is removed, for example, based on video monitoring, weigh sensors on shelves, etc. Information from different combinations of sensors may be used to determine the removal of an item. The server 102 can determine the location of the refrigeration unit 104 and what item is stocked on the shelf. For example, the item information may be retrieved from a store planogram or inventory database. The removed item can then be associated with the customer, and the customer automatically charged for the purchase without the need to stop at a point of sale, as appropriate. The inventory for the store may also be automatically updated to reflect the purchase.

Figure 2:
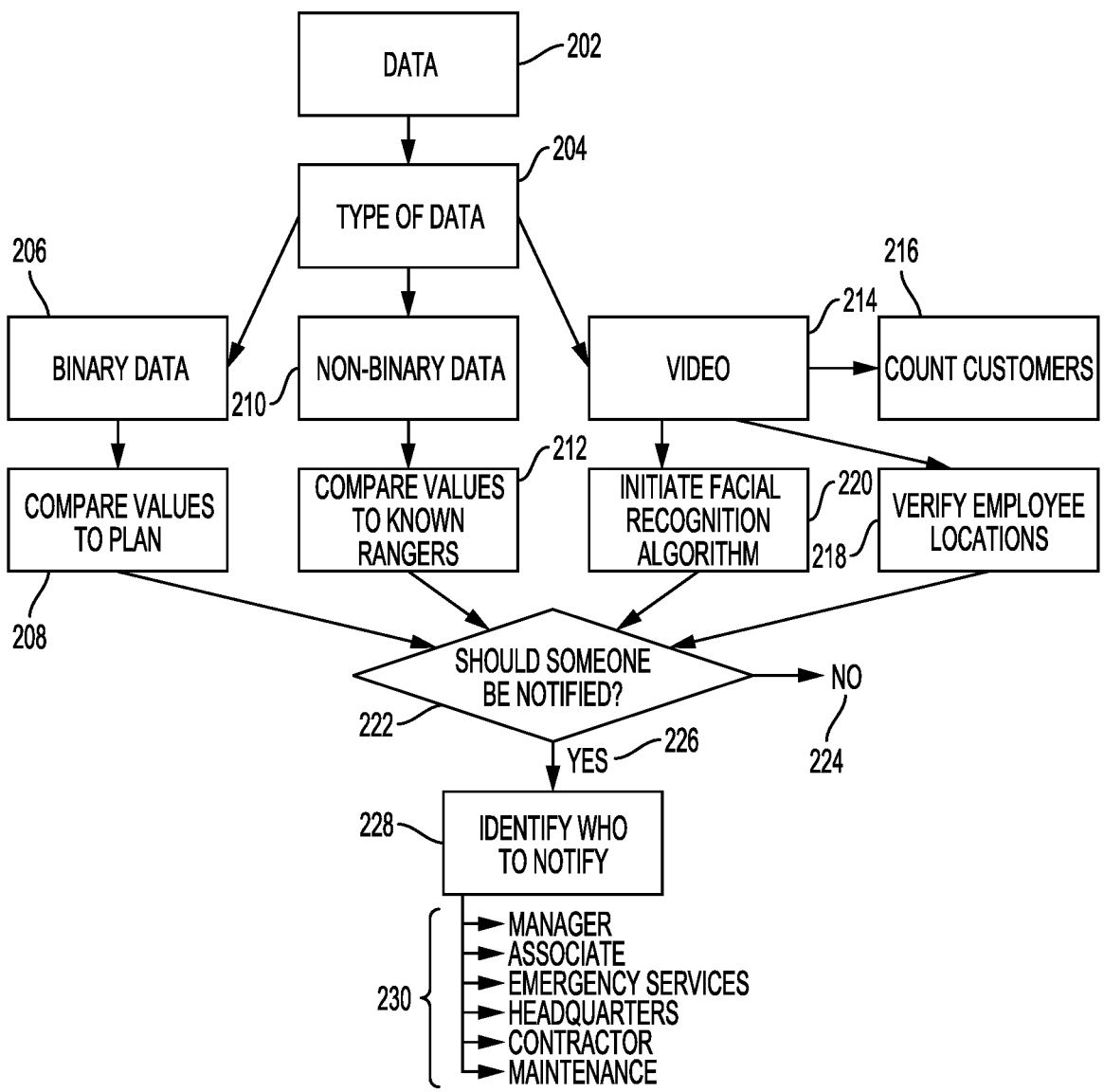
FIG. 2 illustrates an example flowchart for systems configured as described herein.

FIG. 2 illustrates an example flowchart for systems configured as described herein. The steps outlined herein are exemplary and can be implemented in any combination thereof, including combinations that exclude, add, or modify certain steps. In addition, the steps outline herein can be modified to include (or exclude) steps to incorporate other equipment or data according to the principles described herein.

In this example, the server 102 receives data 202 from devices 104-112, 116 within a store. The server 102 may distinguish the data 202 received by (1) the identification of the sensor from which the data was received and (2) the type of data 204 being received. As illustrated, the server 102 separates the data into binary data 206, non-binary data 210, and video 214. Other possible categories of data could include audio from microphone devices, reports from store associates 120, inventory numbers, and/or projected data. Binary data 206, as used herein, can be any data which can be reduced to a "Yes/No," or "1/0" value, such as lights on/off, a door opened closed, presence of individuals/no one present, cash register open/closed, etc. Non-binary data 210, as used herein, can be data which provides more than a binary value, such as the amount of electricity being consumed by a device, how long a door has been open, the number of customers which have entered the store within a time period, the number of customers which have left the store within a time period, the number of customers waiting in line to checkout merchandise from the store, and the locations of store associates. Video data 214 can include video and/or audio being received from a video camera, web cam, or other video recording device.

For binary data 206, the sever 102 can compare the values of the data received to a plan 208. The plan 208 may include thresholds, ranges or normal/abnormal states for the data. If the data 204, when compared to predetermined threshold values, exceeds a threshold, the server can determine if someone should be notified 222. Similarly, for non-binary data 210, the server 102 can compare the values of the data to known ranges 212 and, based on that comparison, determine if someone should be notified 222.

For video data 214, or data similar to video (such as audio data), the data can be used in a variety of distinct ways which may (or may not) overlap. Video monitoring may be performed in areas of the store, such as a checkout area, to determine the presence as well as a number of people in the area. In one example, the server 102 may use video monitoring to initiate a count of customers 216 to determine if a store associate 120 should be sent to that area. For example, if there is a line of customers waiting to check out of the store, the server 102 can automatically count the number of customers waiting in line and, if the number exceeds a threshold, alert the store manager or a store associate to come help with the line. If the video data 214 identifies that a person is in a portion of the store which is off-limits to non-employees, the server 102 can initiate facial recognition algorithms 220 to determine if the possible intruder is an employee. In addition, the server 102 can attempt to verify the locations of employees 218 (using, for example, location data from the store associate's mobile devices). This location data associated with the employee locations can then be combined with the facial recognition data 220 to generate higher level of verification. In addition, the location data of employees can be used by the server 102 to send notifications to the nearest employee when immediate action is required.

When the server 102 determines that no notification is needed 224, the process of receiving data and interpreting the data can continue. When the server 102 determines that a notification should be provided to an individual 226, the server 102 continues receiving and interpreting data while also identifying who to identify 228 and generating the notification based on the data received. Exemplary recipients of a notification may include a store manager, a store associate, emergency services (e.g., police and fire departments), a headquarters or monitoring body, an external contractor, and/or maintenance personnel 230. The notification generated and sent to the selected individual can include the "raw" data received from the sensor (modified to make sense to a human reader), and can also include the server's 102 reasons for contacting the selected individual.

Figure 3:
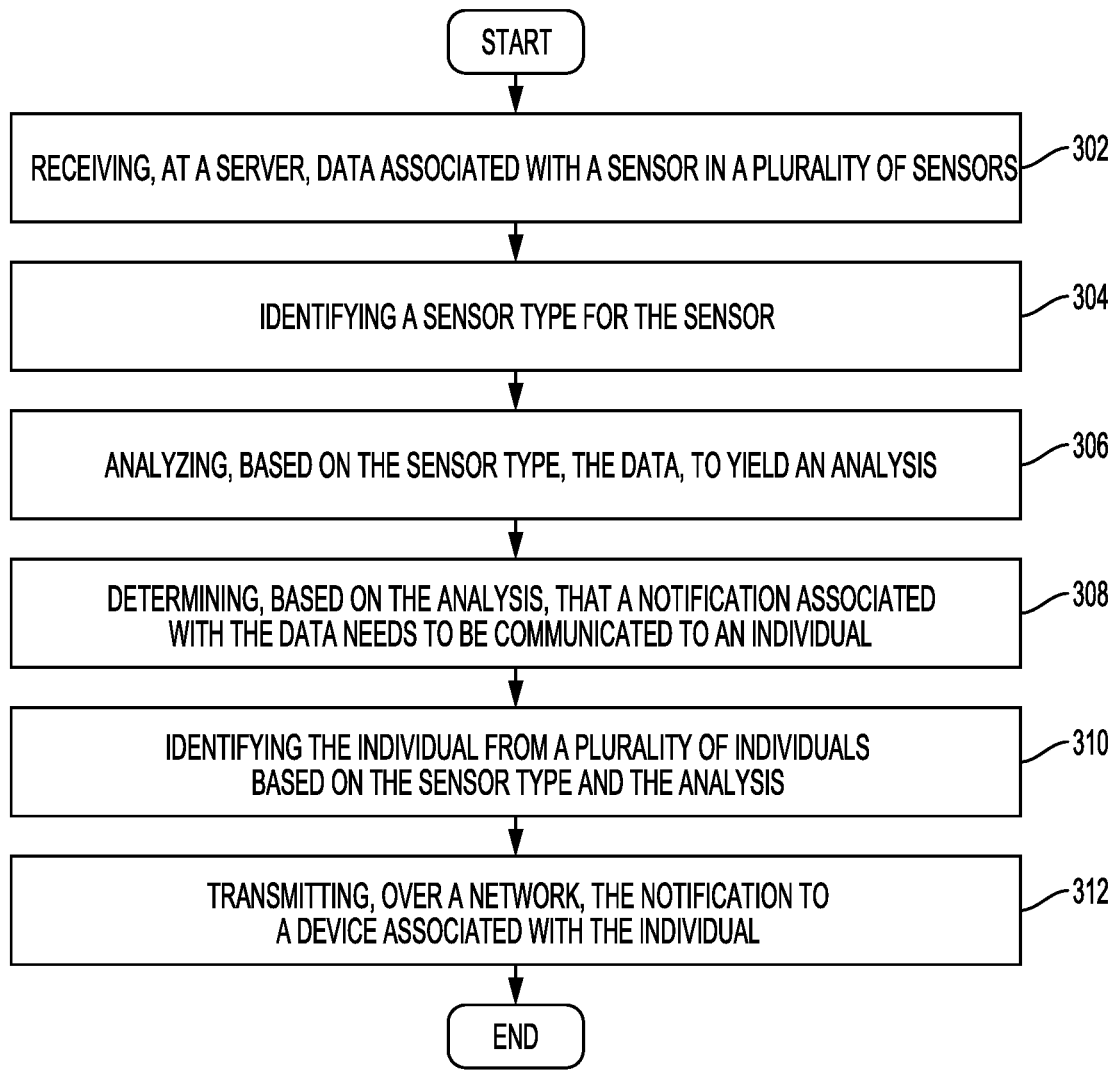
FIG. 3 illustrates an example method embodiment.

FIG. 3 illustrates an exemplary method embodiment. The steps outlined herein are exemplary and can be implemented in any combination thereof, including combinations that exclude, add, or modify certain steps. The steps described herein are described from the perspective of a server 102 as illustrated in FIG. 1. However, in other configurations, a non-server computing device having a processor configured to receive, in real-time or near real-time, data from multiple sensors, can be used to perform the exemplary method illustrated.

The server 102 receives data associated with a sensor in a plurality of sensors (302). The server 102 identifies a sensor type for the sensor (304) and analyses the data based on the sensor type, to yield an analysis (306). Exemplary sensor types can include an air quality monitor, a cooling device, lighting equipment, a door, and a cash register. The server 102 determines, based on the analysis, that a notification associated with the data needs to be communicated to an individual (308). The individual is identified from a plurality of individuals based on, for example, the sensor type and the analysis (310). The individual can also be identified by identifying respective locations for the plurality of individuals and selecting the individual based on a proximity of the individual to the sensor. Such locations of the individuals can be determined, for example, by using the device locations for mobile devices which are each respectively associated with each individual in the plurality of individuals. The server 102 can then transmit, over a network, the notification to a device associated with the individual (312). The server 102 can generate the notification based on the data received, the analysis, and/or the individual to whom the notification will be sent, or the notification can be pre-constructed and saved in a database.

The data being received can be received in real-time from the plurality of sensors, and can be stored in a database in contact with the server 102. When the data is video, analyzing the video can further include performing facial recognition on the data and determining, based at least in part on the facial recognition, that an individual identified in the video is in an area in which they are not authorized. For example, facial recognition may determine that a maintenance worker is in an area and the server 102 may determine that maintenance is scheduled in that area for that time. Thus, there is no need to send any notifications to check on the area. The server 102 may note that the presence of the maintenance worker was detected at the appointed time, suggest that the scheduled work is underway.

In some configurations, the sensor can be associated with an electrical appliance, and wherein the data is associated with electricity being consumed by the electrical appliance. In such configurations, analyzing of the data being received can further include comparing the data to historical data associated with the electrical appliance, to yield a comparison, and identifying, based on the comparison, an increased likelihood of failure of the electrical appliance based on a difference in the electricity being consumed by the electrical appliance and the historical data. The notification generated in such a configuration can, for example, inform the individual receiving the notification of the increased likelihood of failure.

Next, consider an exemplary system configured as described herein. This exemplary system can include a processor and a computer-readable storage device having instructions stored which, when executed by the processor, cause the processor to perform operations comprising: receiving first data associated with a first sensor in a plurality of sensors associated with a device, the first sensor being of a first sensor type; receiving second data associated with a second sensor in the plurality of sensors, the second sensor being of a second sensor type which is distinct from the first sensor type; analyzing the first data, the second data, and a current time, to yield a probable fault associated with the device and an estimated repair time to correct the probable fault; determining, based on the first data, the second data, the current time, and the estimated repair time, an urgency in evaluating the device; determining that the urgency meets a threshold level, to yield a determination; generating, based on the determination, an automated notification to be communicated to an individual, the automated notification prompting the evaluating of the device; selecting the individual by: receiving an electronic signal for each individual in a plurality of individuals, the electronic signal comprising a location of each individual and an identity of each individual; and identifying the individual from the plurality of individuals based on the location of the individual with respect to the device; and transmitting, over a network, the notification to a mobile device associated with the individual.

In such a system, the urgency can be based, at least in part, on average hourly use of the device. The sensors can be of any type found in buildings, stores, campus location, etc. For example, the first sensor type and the second sensor type, while distinct, are each one of a temperature sensor, an electrical current sensor, and a coolant pump pressure, a vibration sensor, a door position sensor, an air pressure sensor, and a water flow sensor.

The respective locations of the plurality of individuals can be determined based on device locations for mobile devices which are each respectively associated with the plurality of individuals. For example, the mobile devices can report GPS locations, or locations within a store, building, or campus, where the mobile device is currently located.

An example of determining the urgency meets a threshold level can include comparing the first sensor data and the second sensor data to historical data where devices failed due to non-repair. For example, a database can have information about how often devices are repaired and when devices have failed. In determining if a threshold is being met, the system can compare the current sensor measurements to the sensor measurements in devices which failed. If the level of similarity between the current device and failed devices is above a threshold amount, then the urgency can increase. The urgency can likewise increase based on timestamps included with the data, and the comparison between the data (including those timestamps) and the historical data.

The individual receiving the notification can be, for example, one of maintenance personnel and a repair service.

Figure 4:
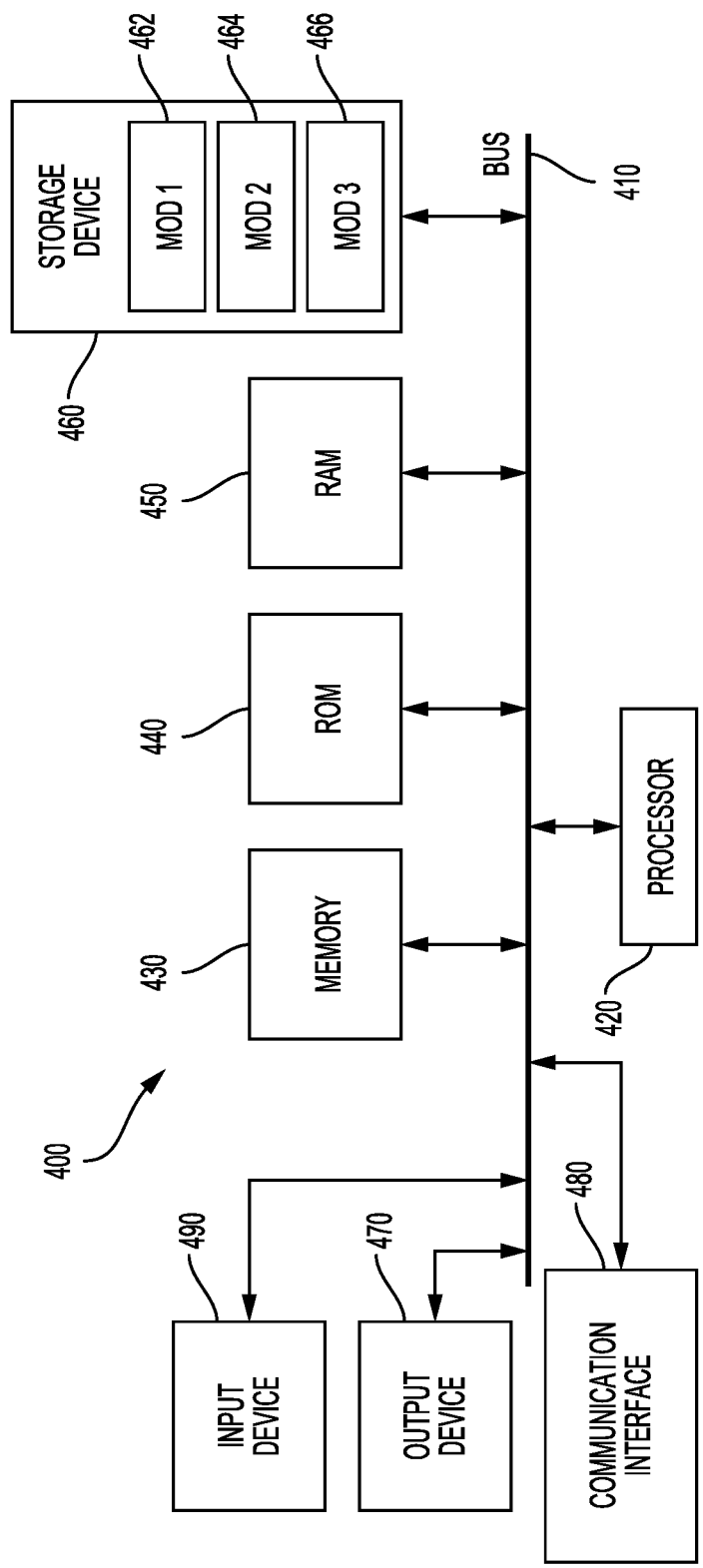
FIG. 4 illustrates an example computer which can be used to practice the concepts disclosed herein.

With reference to FIG. 4, an exemplary system 400 includes a general-purpose computing device 400 which can be used for performing the concepts disclosed herein. This computing device 400 includes a processing unit (CPU or processor) 420 and a system bus 410 that couples various system components including the system memory 430 such as read only memory (ROM) 440 and random access memory (RAM) 450 to the processor 420. The system 400 can include a cache of high speed memory connected directly with, in close proximity to, or integrated as part of the processor 420. The system 400 copies data from the memory 430 and/or the storage device 460 to the cache for quick access by the processor 420. In this way, the cache provides a performance boost that avoids processor 420 delays while waiting for data. These and other modules can control or be configured to control the processor 420 to perform various actions. Other system memory 430 may be available for use as well. The memory 430 can include multiple different types of memory with different performance characteristics. It can be appreciated that the disclosure may operate on a computing device 400 with more than one processor 420 or on a group or cluster of computing devices networked together to provide greater processing capability. The processor 420 can include any general purpose processor and a hardware module or software module, such as module 1 462, module 2 464, and module 3 466 stored in storage device 460, configured to control the processor 420 as well as a special-purpose processor where software instructions are incorporated into the actual processor design. The processor 420 may essentially be a completely self-contained computing system, containing multiple cores or processors, a bus, memory controller, cache, etc. A multi-core processor may be symmetric or asymmetric.

The system bus 410 may be any of several types of bus structures including a memory bus or memory controller, a peripheral bus, and a local bus using any of a variety of bus architectures. A basic input/output (BIOS) stored in ROM 440 or the like, may provide the basic routine that helps to transfer information between elements within the computing device 400, such as during start-up. The computing device 400 further includes storage devices 460 such as a hard disk drive, a magnetic disk drive, an optical disk drive, tape drive or the like. The storage device 460 can include software modules 462, 464, 466 for controlling the processor 420. Other hardware or software modules are contemplated. The storage device 460 is connected to the system bus 410 by a drive interface. The drives and the associated computer-readable storage media provide nonvolatile storage of computer-readable instructions, data structures, program modules and other data for the computing device 400. In one aspect, a hardware module that performs a particular function includes the software component stored in a tangible computer-readable storage medium in connection with the necessary hardware components, such as the processor 420, bus 410, display 470, and so forth, to carry out the function.

In another aspect, the system can use a processor and computer-readable storage medium to store instructions which, when executed by the processor, cause the processor to perform a method or other specific actions. The basic components and appropriate variations are contemplated depending on the type of device, such as whether the device 400 is a small, handheld computing device, a desktop computer, or a computer server.

Although the exemplary embodiment described herein employs the hard disk 460, other types of computer-readable media which can store data that are accessible by a computer, such as magnetic cassettes, flash memory cards, digital versatile disks, cartridges, random access memories (RAMs) 450, and read only memory (ROM) 440, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 400, an input device 490 represents any number of input mechanisms, such as a microphone for speech, a touch-sensitive screen for gesture or graphical input, keyboard, mouse, motion input, speech and so forth. An output device 470 can also be one or more of a number of output mechanisms known to those of skill in the art. In some instances, multimodal systems enable a user to provide multiple types of input to communicate with the computing device 400. The communications interface 480 generally governs and manages the user input and system output. There is no restriction on operating on any particular hardware arrangement and therefore the basic features here may easily be substituted for improved hardware or firmware arrangements as they are developed.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

We claim:

1. A system comprising:
    a processor; and
    a computer-readable storage device having instructions stored which, when executed by the processor, cause the processor to perform operations comprising:
        receiving first data associated with a first sensor in a plurality of sensors associated with a device, the first sensor being of a first sensor type, the first data comprising (1) an identification of the first sensor, and (2) a binary value indicating detected data of the first sensor;
        receiving second data associated with a second sensor in the plurality of sensors, the second sensor being of a second sensor type which is distinct from the first sensor type, the second data comprising (1) an identification of the second sensor, and (2) non-binary data indicating detected data of the second sensor;
        analyzing the first data, the second data, and a current time, to yield a probable fault associated with the device and an estimated repair time to correct the probable fault, the analyzing being part of an iterative machine learning algorithm;
        determining, based on the first data, the second data, the current time, and the estimated repair time, an urgency in evaluating the device;
        determining that the urgency meets a threshold level, to yield a determination;
        generating, based on the determination, an automated notification to be communicated to an individual, the automated notification prompting the evaluating of the device;
        selecting the individual by:
            receiving an electronic signal for each individual in a plurality of individuals, the electronic signal comprising a location of each individual and an identity of each individual; and
            identifying the individual from the plurality of individuals based on (1) the location of the individual with respect to the device, and (2) at least one of the first sensor type or the second sensor type; and
        transmitting, over a network, the notification to a mobile device associated with the individual.

2. The system of claim 1, wherein the urgency is based, at least in part, on average hourly use of the device.

3. The system of claim 1, wherein the first sensor type and the second sensor type, while distinct, are each one of a temperature sensor, an electrical current sensor, and a coolant pump pressure, a vibration sensor, a door position sensor, an air pressure sensor, and a water flow sensor.

4. The system of claim 1, wherein the respective locations of the plurality of individuals are determined based on device locations for mobile devices which are each respectively associated with the plurality of individuals.

5. The system of claim 1, wherein the determining that the urgency meets the threshold level further comprises comparing the first sensor data and the second sensor data to historical data wherein devices failed due to non-repair.

6. The system of claim 1, wherein the individual is one of maintenance personnel and a repair service.

7. A method comprising:
    receiving first data associated with a first sensor in a plurality of sensors associated with a device, the first sensor being of a first sensor type, the first data comprising (1) an identification of the first sensor, and (2) a binary value indicating detected data of the first sensor;
    receiving second data associated with a second sensor in the plurality of sensors, the second sensor being of a second sensor type which is distinct from the first sensor type, the second data comprising (1) an identification of the second sensor, and (2) non-binary data indicating detected data of the second sensor;
    analyzing the first data, the second data, and a current time, to yield a probable fault associated with the device and an estimated repair time to correct the probable fault, the analyzing being part of an iterative machine learning algorithm;
    determining, based on the first data, the second data, the current time, and the estimated repair time, an urgency in evaluating the device;
    determining that the urgency meets a threshold level, to yield a determination;
    generating, based on the determination, an automated notification to be communicated to an individual, the automated notification prompting the evaluating of the device;
    selecting the individual by:
        receiving an electronic signal for each individual in a plurality of individuals, the electronic signal comprising a location of each individual and an identity of each individual; and identifying the individual from the plurality of individuals based on (1) the location of the individual with respect to the device, and (2) at least one of the first sensor type or the second sensor type; and
transmitting, over a network, the notification to a mobile device associated with the individual.

8. The method of claim 7, wherein the first sensor type and the second sensor type are each respectively one of an air quality monitor, a cooling device, lighting equipment, a door, and a cash register.

9. The method of claim 7, wherein identifying of the individual from the plurality of individuals further comprises:
identifying respective locations for the plurality of individuals; and
selecting the individual based on a proximity of the individual to the device.

10. The method of claim 9, wherein the respective locations of the plurality of individuals are determined based on device locations for mobile devices which are each respectively associated with the plurality of individuals.

11. The method of claim 7, wherein the second data is video, and wherein the analyzing of the second data further comprises:
performing facial recognition on the second data; and
determining, based on the facial recognition, that an individual identified in the video is in an area in which they are not authorized.

12. The method of claim 7, wherein the second sensor is associated with an electrical appliance, and wherein the second data is associated with electricity being consumed by the electrical appliance.

13. The method of claim 12, wherein the analyzing of the second data further comprises:
comparing the second data to historical data associated with the electrical appliance, to yield a comparison; and
identifying, based on the comparison, an increased likelihood of failure of the electrical appliance based on a difference in the electricity being consumed by the electrical appliance and the historical data; and
wherein the notification informs the individual of the increased likelihood of failure.

14. A non-transitory computer-readable storage medium having instructions stored which, when executed by a computing device, cause the computing device to perform operations comprising:
receiving first data associated with a first sensor in a plurality of sensors associated with a device, the first sensor being of a first sensor type, the first data comprising (1) an identification of the first sensor, and (2) a binary value indicating detected data of the first sensor;
receiving second data associated with a second sensor in the plurality of sensors, the second sensor being of a second sensor type which is distinct from the first sensor type, the second data comprising (1) an identification of the second sensor, and (2) non-binary data indicating detected data of the second sensor;
analyzing the first data, the second data, and a current time, to yield a probable fault associated with the device and an estimated repair time to correct the probable fault, the analyzing being part of an iterative machine learning algorithm;
determining, based on the first data, the second data, the current time, and the estimated repair time, an urgency in evaluating the device;
determining that the urgency meets a threshold level, to yield a determination;
generating, based on the determination, an automated notification to be communicated to an individual, the automated notification prompting the evaluating of the device;
selecting the individual by:
receiving an electronic signal for each individual in a plurality of individuals, the electronic signal comprising a location of each individual and an identity of each individual; and
identifying the individual from the plurality of individuals based on (1) the location of the individual with respect to the device, and (2) at least one of the first sensor type or the second sensor type; and
transmitting, over a network, the notification to a mobile device associated with the individual.

15. The non-transitory computer-readable storage medium of claim 14, wherein identifying the individual from the plurality of individuals further comprises:
selecting the individual based on a proximity of the individual to the device.

16. The non-transitory computer-readable storage medium of claim 15, wherein the notification indicates that an item is removed.

17. The non-transitory computer-readable storage medium of claim 16, wherein the item removed is associated with the selected individual.

18. The non-transitory computer-readable storage medium of claim 14, wherein the second data is video, and wherein the analyzing of the second data further comprises:
performing facial recognition on the second data; and
selecting the individual based on the facial recognition.

* * * * *